US012396349B2

(12) United States Patent
Lan et al.

(10) Patent No.: US 12,396,349 B2
(45) Date of Patent: Aug. 19, 2025

(54) PIXEL STRUCTURE AND DISPLAY PANEL

(71) Applicant: Hefei Visionox Technology Co., Ltd., Anhui (CN)

(72) Inventors: Lan Lan, Hefei (CN); Yi Qu, Hefei (CN); Menghua Kang, Hefei (CN); Qingqing Dong, Hefei (CN); Shaoya Qiu, Hefei (CN); Dandan Feng, Hefei (CN)

(73) Assignee: Hefei Visionox Technology Co., Ltd., Hefei (CN)

( * ) Notice: Subject to any disclaimer, the term of this patent is extended or adjusted under 35 U.S.C. 154(b) by 614 days.

(21) Appl. No.: 17/859,357

(22) Filed: Jul. 7, 2022

(65) Prior Publication Data

US 2022/0344413 A1   Oct. 27, 2022

Related U.S. Application Data

(63) Continuation of application No. PCT/CN2021/095670, filed on May 25, 2021.

(30) Foreign Application Priority Data

Jul. 28, 2020 (CN) .......................... 202010737380.2

(51) Int. Cl.
    *H01L 27/32*    (2006.01)
    *H10K 59/35*    (2023.01)
(52) U.S. Cl.
    CPC .................................. *H10K 59/353* (2023.02)
(58) Field of Classification Search
    CPC ...... H10K 59/353; H10K 59/00; H10K 59/10; H10K 59/60
    See application file for complete search history.

(56) References Cited

U.S. PATENT DOCUMENTS 9,312,312 B1    4/2016  Tsai et al.
2020/0124927 A1*  4/2020  Kim ................... G02F 1/134336
2021/0159286 A1*  5/2021  Ma ......................... H10K 59/126

FOREIGN PATENT DOCUMENTS

CN    202887618 U    4/2013
CN    106783937 A    5/2017
(Continued)

OTHER PUBLICATIONS

International Search Report (with English Translation) and Written Opinion of the International Searching Authority mailed Jul. 26, 2021, in corresponding International Application No. PCT/CN2021/095670; 11 pages.

(Continued)

*Primary Examiner* — Elmito Breval
(74) *Attorney, Agent, or Firm* — Maier & Maier, PLLC (57) ABSTRACT

The present application discloses a pixel structure and a display panel. The pixel structure includes a plurality of repeating units arranged repeatedly, each of the repeating units includes two pixel units having the same shape and adjacent to each other, each of the pixel units is formed in a triangular shape, and each of the pixel units includes: a plurality of sub-pixels, including a first sub-pixel, a second sub-pixel and a third sub-pixel with different colors and respectively located between a corresponding edge of the pixel unit and the center of the pixel unit; and at least one first light-transmitting portion, wherein each of the at least one first light-transmitting portion is located at a vertex of the pixel unit; wherein in each of the repeating units, the two pixel units have coincident edges which are of equal length and coincident with each other.

19 Claims, 10 Drawing Sheets

(56) References Cited

FOREIGN PATENT DOCUMENTS

| | | |
|---|---|---|
| CN | 111384086 A | 7/2020 |
| CN | 111863911 A | 10/2020 |

OTHER PUBLICATIONS

The First Office Action issued Sep. 22, 2021, in corresponding to Chinese Application No. 202010737380.2; 9 pages (with English Abstract).

* cited by examiner

PIXEL STRUCTURE AND DISPLAY PANEL

CROSS-REFERENCE TO RELATED APPLICATIONS

This application is a continuation of International Application No. PCT/CN2021/095670 filed on May 25, 2021, which claims the priority to Chinese patent application No. 202010737380.2 filed on Jul. 28, 2020 and titled "PIXEL STRUCTURE AND DISPLAY PANEL", both of which are incorporated herein by reference in their entireties.

TECHNICAL FIELD

This application relates to the field of display, and particularly to a pixel structure and a display panel.

BACKGROUND

With a rapid development of electronic devices, users have higher and higher requirements for screen-to-body ratios, such that the industry has shown more and more interest in all-screen displays of electronic devices.

There is a need for traditional electronic devices, such as mobile phones and tablets, to have front-facing cameras, earpieces, and infrared sensing components etc. integrated thereon. In the prior art, notches or holes may be provided on display screens, so that external light can enter photosensitive elements under the screens through the notches or holes on the screens. However, these electronic devices do not have actual all-screen displays, since not all regions across the screens can be used to display, for example, regions corresponding to front-facing cameras cannot be used to display pictures.

SUMMARY

Embodiments of the present application provide a pixel structure and a display panel, enabling at least a part of regions of the display panel to be light-transmitting and display.

In one aspect, embodiments of the present application provide a pixel structure, the pixel structure includes a plurality of repeating units arranged repeatedly, each of the repeating units includes two pixel units having the same shape and adjacent to each other, each of the pixel units is formed in a triangular shape, and each of the pixel units includes: a plurality of sub-pixels, including a first sub-pixel, a second sub-pixel and a third sub-pixel with different colors, wherein the first sub-pixel, the second sub-pixel and the third sub-pixel are respectively located between a corresponding edge of the pixel unit and the center of the pixel unit; and at least one first light-transmitting portion, wherein each of the at least one first light-transmitting portion is located at a vertex of the pixel unit; wherein in each of the repeating units, the two pixel units have coincident edges which are of equal length and coincident with each other.

In another aspect, embodiments of the present application provide a display panel including the pixel structure according to any of the above implementations of one aspect of the present application.

According to the pixel structure of the embodiments of the present application, each pixel unit includes a plurality of sub-pixels and a first light-transmitting portion. The plurality of sub-pixels includes a first sub-pixel, a second sub-pixel and a third sub-pixel with different colors. The sub-pixels with three colors can be used to display three primary colors, and respectively located between a corresponding edge of the pixel unit and the center of the pixel unit to present a regular arrangement in each pixel unit, which makes the color rendering of the pixel structure higher and makes the display effect better. Each first light-transmitting portion is located at a vertex of the pixel unit, and in each repeating unit, the two pixel units have coincident edges which are of equal length and coincident with each other, so that the first light-transmitting portions in the pixel structure forms a regular and more uniformly distributed arrangement structure, which improves the light transmittance of the display panel including the pixel structure and enables the light to be uniformly transmitted to a certain extent. Thus, it is convenient to be applied to the light-transmitting display technology or the under-screen photosensitive element integration technology.

BRIEF DESCRIPTION OF THE DRAWINGS

Other features, objects and advantages of the present application will become more apparent upon reading the following detailed description of non-limiting embodiments with reference to the accompanying drawings, wherein the same or similar reference signs indicate the same or similar features and the accompanying drawings are not drawn to actual scale.

DETAILED DESCRIPTION

Features and exemplary embodiments of various aspects of the present application will be described in detailed below. In order to make the objects, technical solutions and advantages of the present application clearer, the present application is further described in details below with reference to the accompany drawings and specific embodiments. It should be understood that the specific embodiments described herein are only for illustration of the present application, and are not for limiting the present application. For those skilled in the art, the present application can be implemented without some of those specific details. The below description of embodiments is only for providing better understanding of the present application by showing examples of the present application.

It should be noted that, in the present application, relational terms such as first and second are used only to distinguish one entity or operation from another entity or operation, and do not necessarily require or imply any such actual relationship or sequence exists between these entities or operations.

Figure 1:
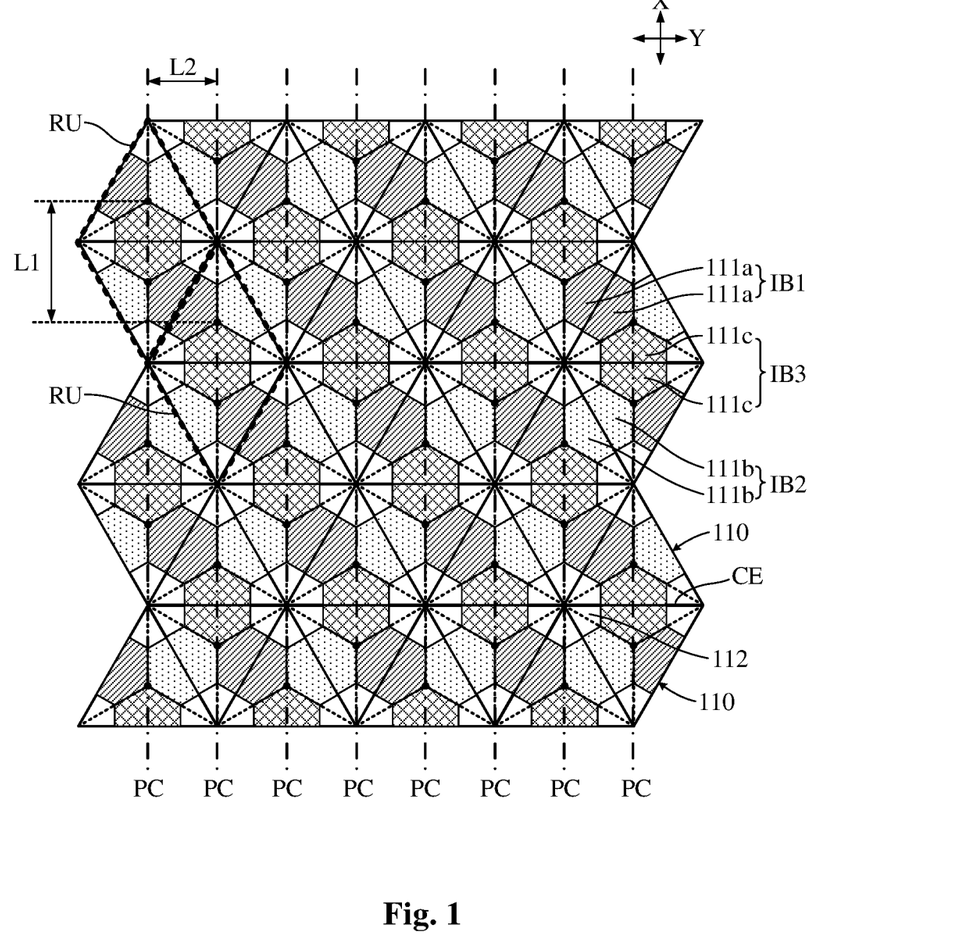
FIG. 1 is a structural schematic diagram of a pixel structure provided according to a first embodiment of the present application, wherein a plurality of repeating units are arranged along a first direction to form a pixel column.

An embodiment of the present application provides a pixel structure. FIG. 1 is a schematic structural diagram of a pixel structure provided according to a first embodiment of the present application. The pixel structure of the embodiment of the present application includes a plurality of repeating units (RU) arranged repeatedly.

Figure 2:
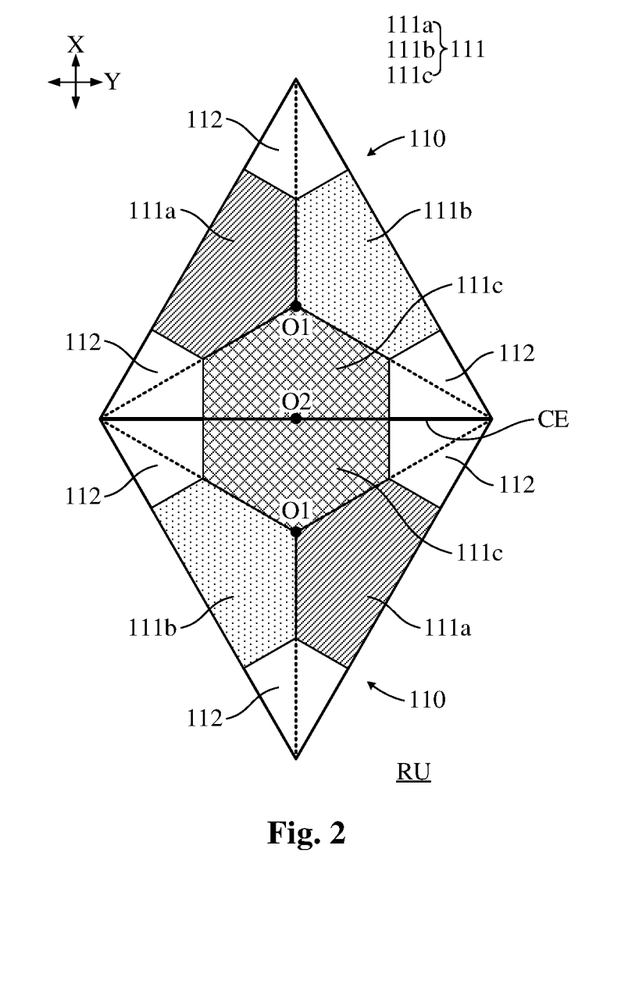
FIG. 2 is a schematic structural diagram of a repeating unit in the pixel structure provided according to the first embodiment of the present application.
Figure 3:
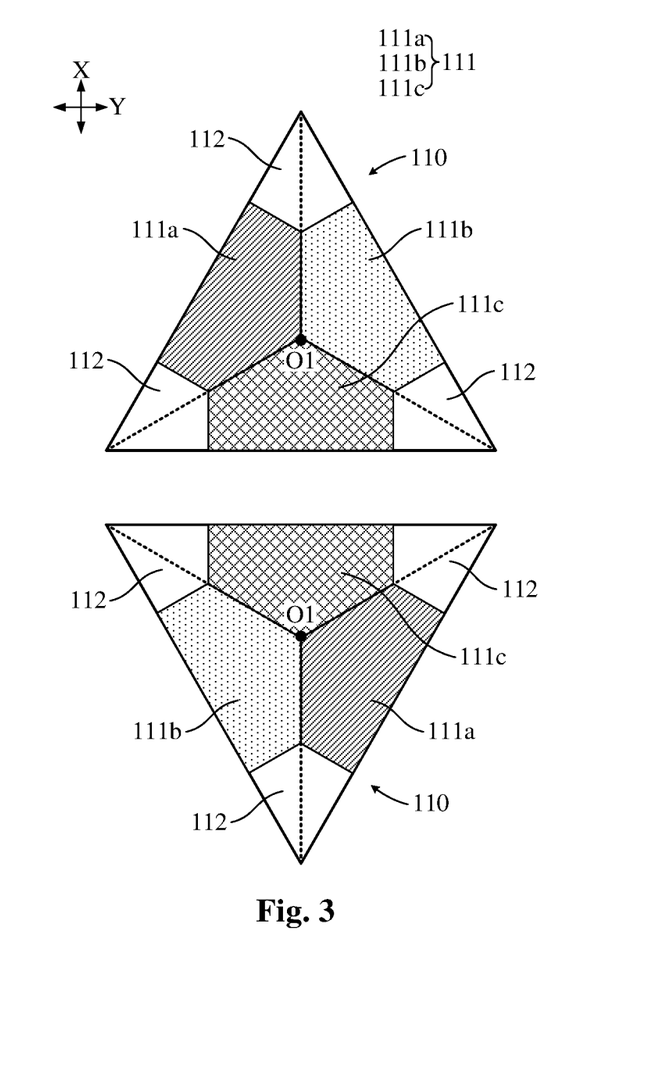
FIG. 3 is an exploded schematic diagram of the repeating unit in the pixel structure provided according to the first embodiment of the present application.

FIG. 2 is a schematic structural diagram of a repeating unit in the pixel structure provided according to the first embodiment of the present application. Each repeating unit RU includes two pixel units 110 with the same shape and adjacent to each other, and each pixel unit 110 is formed in a triangular shape. FIG. 3 is an exploded schematic diagram of the repeating unit in the pixel structure provided according to the first embodiment of the present application, the two pixel units 110 are shown separately in FIG. 3.

Each pixel unit 110 includes a plurality of sub-pixels 111 and at least one first light-transmitting portion 112. The plurality of sub-pixels 111 include a first sub-pixel 111a, a second sub-pixel 111b and a third sub-pixel 111c with different colors. The first sub-pixel 111a, the second sub-pixel 111b and the third sub-pixel 111c are respectively located between a corresponding edge of the pixel unit 110 and the center O1 of the pixel unit 110. Each of the first light-transmitting portions 112 is arranged at one vertex of the pixel unit 110. In each repeating unit RU, the two pixel units 110 have coincident edges (CE) which are of equal length and coincident with each other.

The pixel unit 110 may be formed in any triangular shape, such as a right triangle, an isosceles triangle, an equilateral triangle, or other irregular triangles. Each sub-pixel 111 may be adjacent to one respective edge of the pixel unit 110 and adjacent to the center O1 of the pixel unit 110. The center O1 of the pixel unit 110 refers to the intersection of the center lines of the pixel unit 110 which is formed in the triangular shape. In each pixel unit 110, the number of the first light-transmitting portions 112 may be one, two or three.

The first sub-pixel 111a, the second sub-pixel 111b and the third sub-pixel 111c can be respectively used for displaying three primary colors, for example, in the first sub-pixel 111a, the second sub-pixel 111b and the third sub-pixel 111c, one of them is a red sub-pixel, another one is a blue sub-pixel, and the remaining one is a green sub-pixel.

According to the pixel structure of the embodiments of the present application, each pixel unit 110 includes a plurality of sub-pixels 111 and a first light-transmitting portion 112. The plurality of sub-pixels 111 include a first sub-pixel 111a, a second sub-pixel 111b and a third sub-pixel 111c with different colors, and the sub-pixels 111 with the three colors can be used to display three primary colors, and respectively located between a corresponding edge of the pixel unit 110 and the center O1 of the pixel unit 110 to present a regular arrangement in each pixel unit 110, which makes the color rendering of the pixel structure higher and makes the display effect better. Each first light-transmitting portion 112 is located at a vertex of the pixel unit 110, and in each repeating unit RU, the two pixel units 110 have coincident edges CE which are of equal length and coincident with each other, so that the first light-transmitting portions 120 in the pixel structure form a regular and more uniformly distributed arrangement structure, which improves the light transmittance of the display panel including the pixel structure and enables the light to be uniformly transmitted to a certain extent. Thus, it is convenient to be applied to the light-transmitting display technology or the under-screen photosensitive element integration technology.

The pixel structure of the embodiments of the present application may be used in an Organic Light Emitting Diode (OLED) display panel or a display device, wherein each sub-pixel 111 may be an OLED light-emitting element. When the sub-pixel 111 is an OLED light-emitting element, it includes a plurality of organic film layers, and at least some of the organic film layers can be formed by an evaporation process.

In some embodiments, in each of the repeating units, the colors of the sub-pixels 111 respectively corresponding to the two pixel units 110 having the coincident edges CE and respectively corresponding to the coincident edges CE are the same as each other. In this embodiment, in each pixel unit 110, the third sub-pixel 111c is disposed adjacent to the coincident edge CE. Therefore, in each repeating unit RU, the third sub-pixels 111c of the two pixel units 110 are adjacent to each other. During the formation of the sub-pixels 111, at least some of the film layers of the third sub-pixels 111c of the two pixel units 110 can be formed by evaporation through openings of a same mask plate, which can reduce the process pressure of the mask plate, reduce the requirement on the fineness of the openings of the mask plate, and thus reduce the production cost.

In some embodiments, in each repeating unit RU, the two pixel units 110 are symmetrical about the midpoint O2 of the coincident edge CE, so that in each repeating unit RU, the distribution of the sub-pixels 110 is more symmetrical and uniform, which improves the display effect. For example, in the embodiment of FIG. 2, the coincident edge CE extends laterally, one of the two pixel units 110 is located above the coincident edge CE along the longitudinal direction, and the other is located below the coincident edge CE along the longitudinal direction. For the pixel unit 110 located above the coincident edge CE along the longitudinal direction, the first sub-pixel 110a is located in the upper left area of the pixel unit 110, the second sub-pixel 110b is located in the upper right area of the pixel unit 110, and the third sub-pixel 110c is located in the lower area of the pixel unit 110; and for the pixel unit 110 located below the coincident edge CE along the longitudinal direction, the first sub-pixel 110a is located in the lower right area of the pixel unit 110, the second sub-pixel 110b is located in the lower left area of the pixel unit 110, and the third sub-pixel 110c is located in the upper area of the pixel unit 110, which enables the first sub-pixel 110a, the second sub-pixel 110b and the third sub-pixel 110c with different light-emitting colors are distributed more uniformly in each repeating unit RU, the display effect of the pixel structure for image display is thus improved.

In some embodiments, each of the pixel units 110 is formed in an equilateral triangular shape. The shapes of the first sub-pixel 111a, the second sub-pixel 111b and the third sub-pixel 111c are the same as each other. In FIG. 2 and FIG. 3, the center lines of each pixel unit 110 are shown by dashed lines. In each pixel unit 110, every two adjacent sub-pixels 111 are arranged on two sides of a center line of the pixel unit 110, and each vertex of the pixel unit 110 is provided with the first light-transmitting portion 112. In the present embodiment, each sub-pixel 111 is formed in an axisymmetric pentagonal shape. Specifically, taking the third sub-pixel 111c as an example, the third sub-pixel 111c is formed in an axisymmetric pentagonal shape, wherein the symmetry axis is a straight line passing through the center O1 of the pixel unit 110 and perpendicular to the coincident edge CE. The shapes of the first sub-pixel 111a and the second sub-pixel 111b is the same as that of the third sub-pixel 111c, wherein the third sub-pixel 111c coincides with the first sub-pixel 111a when rotated 120° clockwise around the center O1 of the pixel unit 110, and the third sub-pixel 111c coincides with the second sub-pixel 111b when rotated 120° counterclockwise around the center O1 of the pixel unit 110. In this embodiment, each pixel unit 110 is formed in an equilateral triangular shape, and the shapes of the first sub-pixel 111a, the second sub-pixel 111b and the third sub-pixel 111c are the same as each other, so that the sub-pixels 111 of the three colors are evenly arranged in each pixel unit 110, which improves the color rendering when the pixels are arranged for display, and reduces the possibility of color cast.

Each vertex of the pixel unit 110 is provided with a first light-transmitting portion 112. In some embodiments, the shapes of the first light-transmitting portions 112 in each pixel unit 110 are the same as each other. In this embodiment, in each pixel unit 110, each sub-pixel 111 is formed in an axis-symmetric pentagonal shape, and the remaining areas of the pixel unit 110 are first light-transmitting portions 112. Each of the first light-transmitting portions 112 is disposed at a respective vertex of the pixel unit 110, and each of the first light-transmitting portions 112 is approximately formed in a spindle shape. In this embodiment, the shapes of the first light-transmitting portions 112 in each pixel unit 110 are the same as each other. When the repeating units RU are arranged in a predetermined regularity, the first light-transmitting portions 112 are more uniformly distributed in the pixel structure, which enables the light passing through the display panel including the pixel structure more uniformly, and it is convenient for the array-type photosensitive element to be integrated on the back of the display panel.

As shown in FIG. 1, the plurality of repeating units RU are arranged along the first direction X to form a pixel column PC, wherein the coincident edge CE in each repeating unit RU is perpendicular to the first direction X, and a plurality of pixel columns PC are arranged along the second direction Y, wherein the second direction Y is perpendicular to the first direction X. In FIG. 1, the central axis of each pixel column PC is shown by a dashed-dotted line.

In some embodiments, the adjacent pixel columns PC are misaligned from each other along the first direction X, and sub-pixels 111 facing each other in the adjacent pixel columns PC have the same color. During the formation of the sub-pixels 111, at least some of the film layers of the sub-pixels 111 facing each other and with the same color in the adjacent pixel columns PC can be formed by evaporation through openings of a same mask plate, so as to reduce process pressure of the mask plate.

In this embodiment, the first sub-pixels 111a of the adjacent pixel columns PC are interconnected as first interconnection blocks IB1, and the second sub-pixels 111b of the adjacent pixel columns PC are interconnected as second interconnection blocks IB2. Herein, the interconnection block formed by interconnecting adjacent sub-pixels refers to the interconnection structure formed by at least some of the film layers of the adjacent sub-pixels which are connected to each other, for example, the interconnection structure formed by some of the organic film layers of the OLED light-emitting elements which are connected to each other. In this embodiment, at least some of the film layers in the first interconnect block IB1 can be formed by evaporation through the opening of the same mask plate, and at least some of the film layers in the second interconnect block IB2 can be formed by evaporation through the opening of the same mask plate.

In some embodiments, the first interconnection block IB1 and the second interconnection block IB2 have the same shape, and since the adjacent pixel columns PC are misaligned with each other along the first direction X and the sub-pixels facing each other in the adjacent pixel columns PC have the same color, the arrangement structure of the first interconnection block IB1 is the same as that of the second interconnection block IB2 in the pixel structure. At this time, the same mask plate can be used for forming the first interconnection block IB1 and the second interconnection block IB2 by evaporation, so that the cost of the mask plate can be saved during the process of forming the sub-pixels 111.

As shown in FIG. 1, as mentioned above, the adjacent pixel columns PC are misaligned from each other along the first direction X, specifically, the adjacent pixel columns PC are misaligned from each other along the first direction X by a first preset distance L1, the distance between the central axes of the adjacent pixel columns PC is a second preset distance L2.

In this embodiment, the pixel unit 110 is formed in an equilateral triangular shape, the first preset distance L1 is equal to a height of the equilateral triangle, and the second preset distance L2 is equal to half of a length of an edge of the equilateral triangle, so that adjacent pixel columns PC are connected to each other. By configuring the first preset distance L1 and the second preset distance L2 as described above, the pixel units 110 in the adjacent pixel columns PC are closely connected, which can improve the tightness of the arrangement of the sub-pixels 111 in the pixel structure, enable the arrangement of a larger number of sub-pixels 111 within a certain layout area, and improves the pixel density (Pixels Per Inch, PPI) of the pixel structure.

As described above, the first sub-pixels 111a of the adjacent pixel columns PC are interconnected as the first interconnection block IB1, and the second sub-pixels 111b of the adjacent pixel columns PC are interconnected as the second interconnection block IB2. In this embodiment, in each repeating unit RU, the third sub-pixels 111c of the two pixel units 110 are corresponding to the coincident edges CE, and are interconnected as a third interconnection block IB3, so that at least some of the film layers of the third interconnection block IB3 can be formed by evaporation through the openings of the same mask plate.

In some embodiments, since the first interconnection block IB1, the second interconnection block IB2 and the third interconnection block IB3 have the same shape, and the positions of the first sub-pixels 111a, the second sub-pixels 111b and the third sub-pixels 111c are configured according the above embodiments, in the pixel structure, the arrangement structures of the first interconnection block IB1, the second interconnection block IB2 and the third interconnection block IB3 are the same. At this time, the same mask plate can be shared in the formation of the first interconnection block IB1 by evaporation, the formation of the second interconnection block IB2 by evaporation and the formation of the third interconnection block IB3 by evaporation, so that the cost of the mask plate can be saved during the formation process of the sub-pixels 111.

Figure 4:
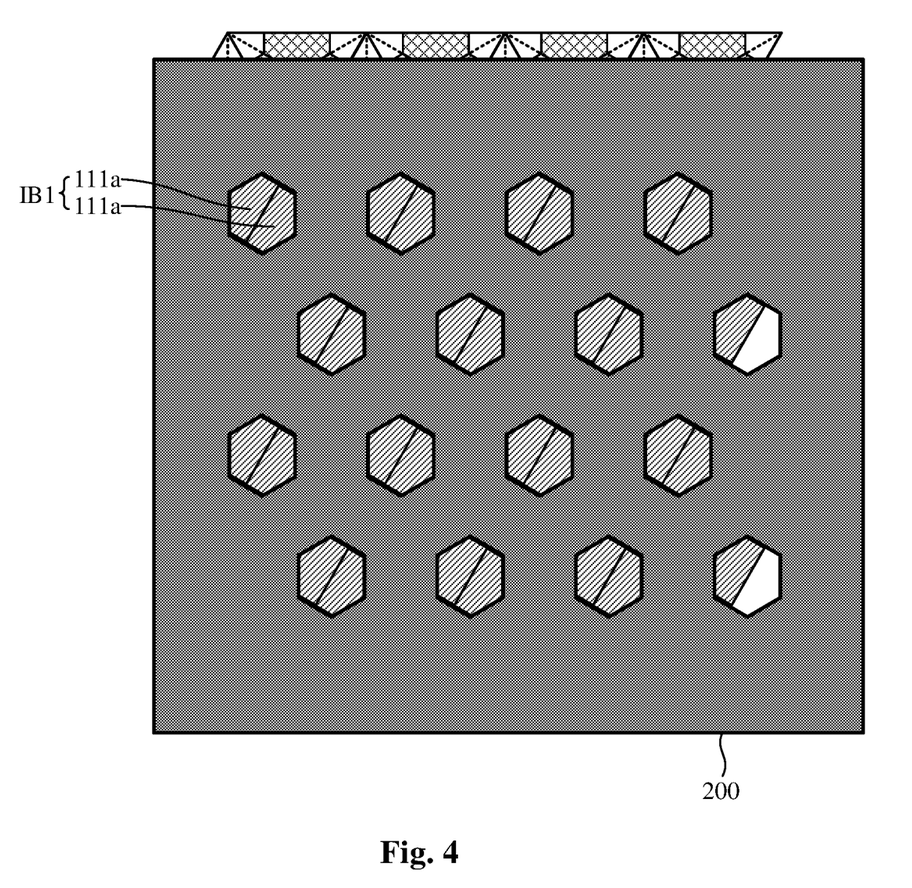
FIG. 4 is a schematic structural diagram of forming a first sub-pixel in the pixel structure provided by the first embodiment of the present application through a mask plate.
Figure 5:
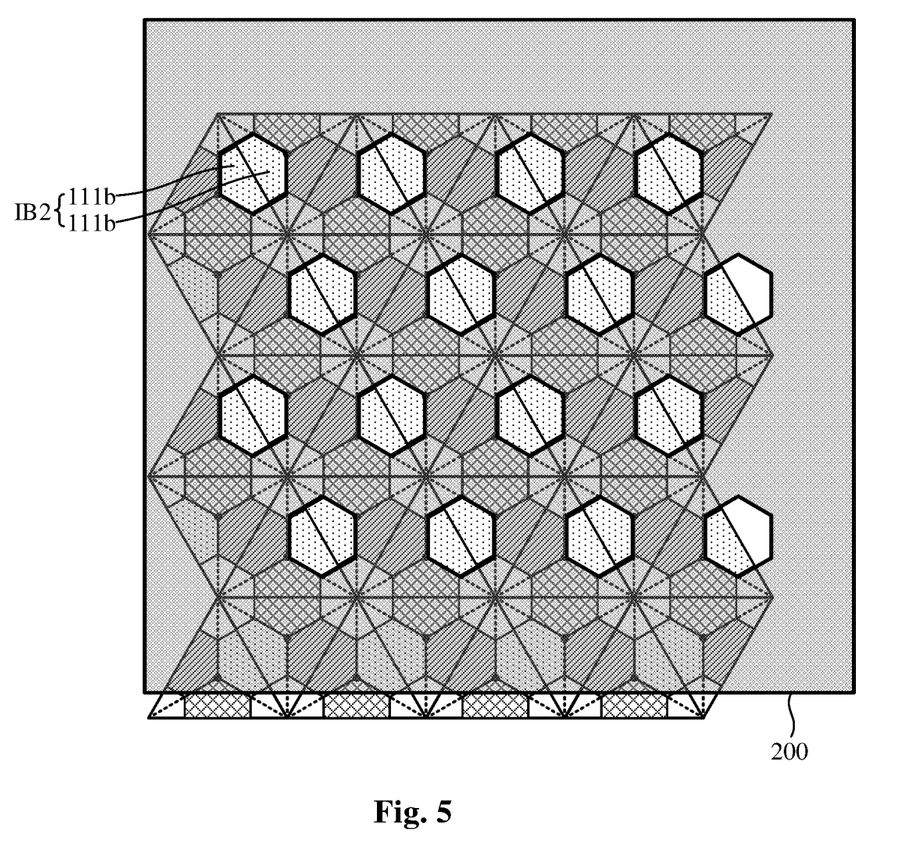
FIG. 5 is a schematic structural diagram of forming a second sub-pixel in the pixel structure provided by the first embodiment of the present application through a mask plate.
Figure 6:
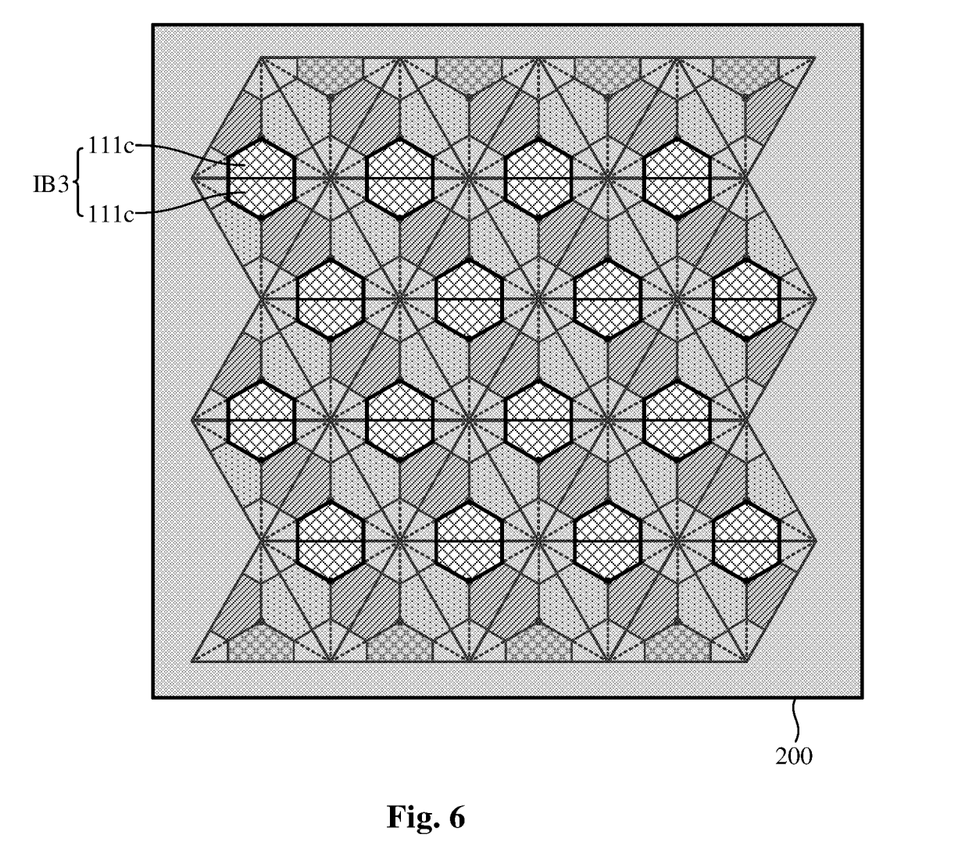
FIG. 6 is a schematic structural diagram of forming a third sub-pixel in the pixel structure provided by the first embodiment of the present application through a mask plate.

FIG. 4, FIG. 5 and FIG. 6 are schematic structural diagrams of forming the first sub-pixel, the second sub-pixel and the third sub-pixel in the pixel structure provided by the first embodiment of the present application through a mask plate, respectively. A same mask plate 200 is shared when forming the first sub-pixel 111a, the second sub-pixel 111b and the third sub-pixel 111c.

As shown in FIG. 4, when the first sub-pixels 111a are formed by the evaporation process, the openings on the mask plate 200 exposes the regions corresponding to respective first interconnection blocks IB1, i.e., the regions corresponding to the first sub-pixels 111a are exposed, and the regions corresponding to the second sub-pixels 111b and the third sub-pixels 111c are shielded, so that the evaporation material used to form the first sub-pixels 111a can pass through the mask openings of the mask plate 200 to form films in the regions corresponding to the first interconnection blocks IB1.

As shown in FIG. 5, when the second sub-pixels 111b are formed by the evaporation process, the mask openings on the mask plate 200 expose the regions corresponding to respective second interconnection blocks IB2, i.e., the regions corresponding to the second sub-pixels 111b are exposed, and the regions corresponding to the first sub-pixels 111a and the third sub-pixels 111c are shielded, so that the evaporation material used to form the second sub-pixels 111b can pass through the mask openings of the mask plate 200 to form films in the regions corresponding to the second interconnection blocks IB2.

As shown in FIG. 6, when the third sub-pixels 111b are formed by the evaporation process, the mask opening on the mask plate 200 exposes the regions corresponding to respective third interconnection blocks IB3, i.e., the regions corresponding to the third sub-pixels 111c are exposed, and the regions corresponding to the first sub-pixel 111a and the second sub-pixel 111b are shielded, so that the evaporation material used for forming the third sub-pixels 111c can pass through the mask opening of the mask plate 200 to form films in the region corresponding to the third interconnection block IB3.

In addition, according to the pixel structure of the above-mentioned embodiments, the first light-transmitting portions 112 of a plurality of pixel units 110 sharing a common vertex form a regular pattern. For example, in this embodiment, the plurality of first light-transmitting portions 112 sharing a common vertex form a regular hexagon. In the pixel structure, a regular and uniformly distributed light transmission regions can be formed, which improves the light transmittance and light transmission uniformity of the display panel including the pixel structure.

In the pixel structure of the above embodiments of the present application, the pixel units 110 in the adjacent pixel columns PC are closely connected, which can improve the PPI of the pixel structure. However, according to different requirements of PPI of the pixel structure, the arrangement of the pixel columns PC in the pixel structure can be adjusted.

Figure 7:
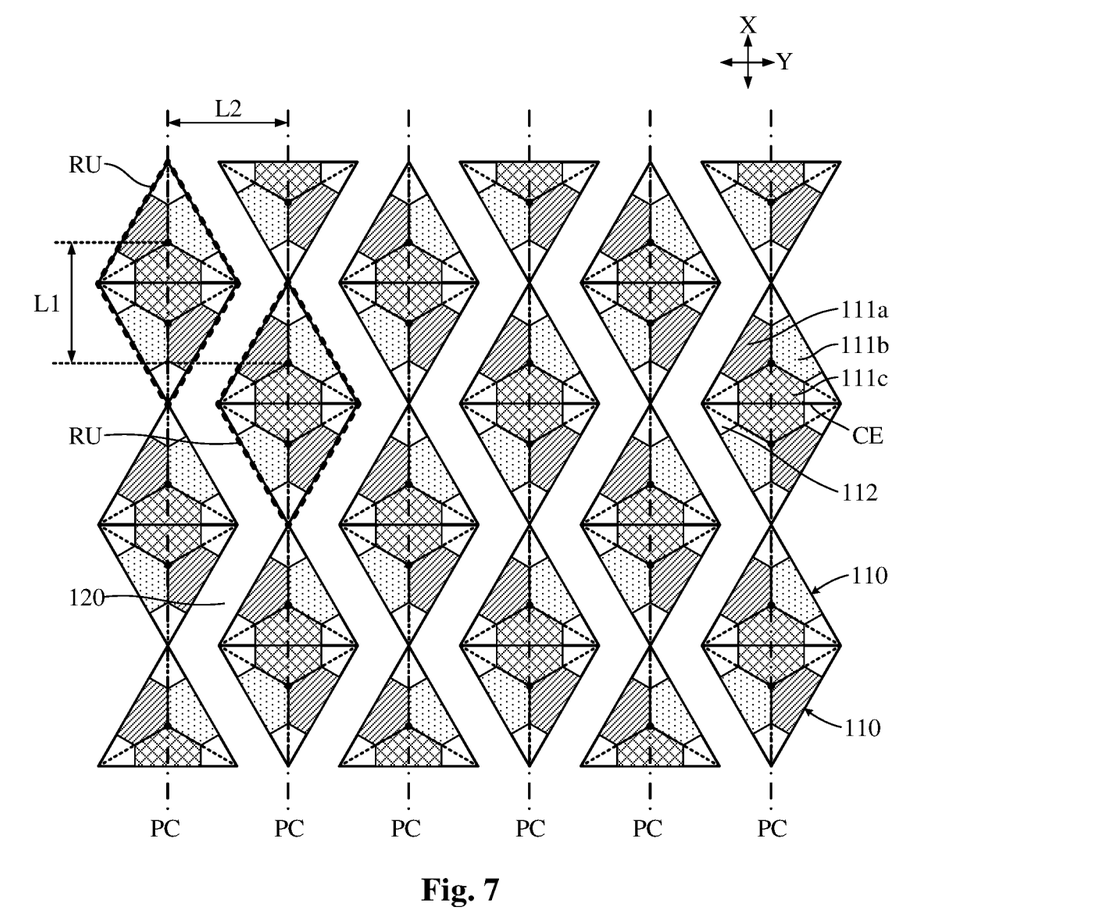
FIG. 7 is a schematic structural diagram of a pixel structure provided according to a second embodiment of the present application, wherein adjacent pixel columns are spaced from each other.

FIG. 7 is a schematic structural diagram of a pixel structure provided according to a second embodiment of the present application. Most of the pixel structure of the second embodiment is the same as the first embodiment, and the differences between the second embodiment and the first embodiment will be described below. The same parts will not be described in detail.

In the pixel arrangement, the adjacent pixel columns PC are misaligned from each other along the first direction X by a first preset distance L1, and the distance between the central axes of the adjacent pixel columns PC is a second preset distance L2.

Different from the first embodiment, in the second embodiment, the first preset distance L1 is equal to a height of the equilateral triangle, and the second preset distance L2 is greater than half of a length of an edge of the equilateral triangle, so that the adjacent pixel columns PC are spaced apart from each other. Compared with the first embodiment, the pixel density of the pixel structure of this embodiment changes along the second direction Y. According to the requirements of the pixel density of the required pixel structure, the spacing between the adjacent pixel columns PC can be adjusted to improve the universality of the pixel structure of the embodiments of the present application.

In some embodiments, the pixel structure further includes a second light-transmitting portion 120, and the second light-transmitting portion 120 is located between the adjacent pixel columns PC, so as to utilize the space between the adjacent pixel columns PC, which further improves the light transmission performance of the display panel including the pixel structure.

In some embodiments, the second preset distance L2 is equal to the first preset distance L1, i.e., the second preset distance L2 is also equal to a height of the equilateral triangle, so that the ratio of the arrangement density of the pixel units 110 in the first direction X to the arrangement density of the pixel units 110 in the second direction Y is 1:1, which further improves the display effect of the pixel structure.

Figure 8:
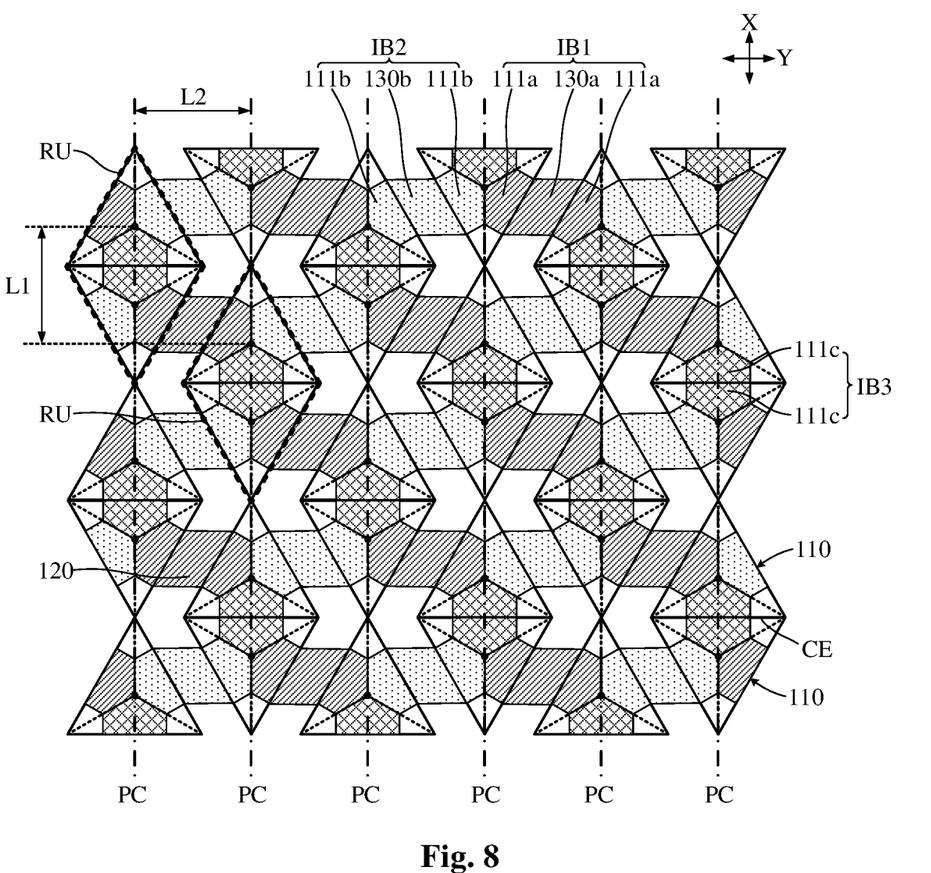
FIG. 8 is a schematic structural diagram of a pixel structure provided according to a third embodiment of the present application, wherein sub-pixels in the adjacent pixel columns are connected to each other through a first connecting portion located between sub-pixels of the adjacent pixel columns.

FIG. 8 is a schematic structural diagram of a pixel structure provided according to a third embodiment of the present application. Most of the pixel structure of the third embodiment is the same as the second embodiment, and the differences between the third embodiment and the second embodiment will be described below. The same parts will not be described in detail.

As shown in FIG. 8, a plurality of repeating units RU are arranged along the first direction X to form a pixel column PC, wherein the coincident edge CE in each repeating unit RU is perpendicular to the first direction X, and a plurality of pixel columns PC are arranged along the second direction Y, wherein the second direction Y is perpendicular to the first direction X. In FIG. 8, the central axis of each pixel column PC is shown by a dashed-dotted line. The adjacent pixel columns PC are misaligned from each other along the first direction X, and the sub-pixels 111 facing each other in the adjacent pixel columns PC have the same color.

In this embodiment, the first sub-pixels 111a in the adjacent pixel columns PC are interconnected as first interconnection blocks IB1, and the second sub-pixels 111b in the adjacent pixel columns PC are interconnected as second interconnection blocks IB2.

Specifically, the first sub-pixels 111a of the adjacent pixel columns PC are facing each other and spaced apart from each other, and the first sub-pixels 111a in the adjacent pixel columns PC are connected to each other through a first connection portion 130a located between the first sub-pixels 111a respectively in the adjacent pixel columns PC. At least some of the film layers (e.g., at least some of the organic film layers) of the two first sub-pixels 111a and the first connection portion 130a of the first interconnection block IB1 are connected to each other, and these film layers of the first interconnection block IB1 can be formed by evaporation through the opening of a same mask plate.

The second sub-pixels 111*b* in the adjacent pixel columns PC are facing each other and spaced apart from each other, and the second sub-pixels 111*b* in the adjacent pixel columns PC are connected to each other through a second connection portion 130*b* located between the second sub-pixels 111*b* respectively in the adjacent pixel columns PC. At least some of the film layers (e.g., at least some of the organic film layers) of the two second sub-pixels 111*b* and the second connection portion 130*b* of the second interconnection block IB2 are connected to each other, and these film layers of the second interconnection block IB2 can be formed by evaporation through the opening of a same mask plate.

In some embodiments, the shapes of the first interconnection block IB1 and the second interconnection block IB2 are the same, and since the adjacent pixel columns PC are misaligned with each other along the first direction X, and the sub-pixels 111 facing each other and respectively in the adjacent pixel columns PC have the same color, in the pixel structure, the arrangement structure of the first interconnection block IB1 is the same as that of the second interconnection block IB2. At this time, the first interconnection block IB1 and the second interconnection block IB2 can formed by evaporation with a same mask plate, so that the cost of the mask plate can be saved during the process of forming the sub-pixels 111.

In this embodiment, in each repeating unit RU, the third sub-pixels 111*c* of the two pixel units 110 are corresponding to the coincident edge CE, and are interconnected as a third interconnection block IB3, so that at least some of the film layers of the third interconnection block IB3 can be formed by evaporation through the opening of a same mask plate.

Embodiments of the present application further provide a display panel, which includes the pixel structure according to any of the foregoing embodiments of the present application.

Figure 9:
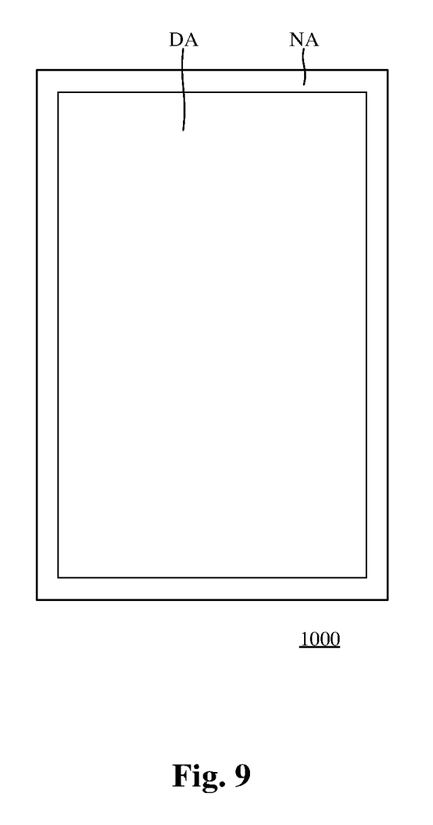
FIG. 9 is a schematic structural diagram of a display panel provided according to the first embodiment of the present application.

FIG. 9 is a schematic structural diagram of a display panel provided according to a first embodiment of the present application. In this embodiment, the display panel 1000 includes a display area (DA) and a non-display area (NA) surrounding the periphery of the display area DA. The pixel structure of any of the foregoing embodiments is arranged in the display area DA.

Figure 10:
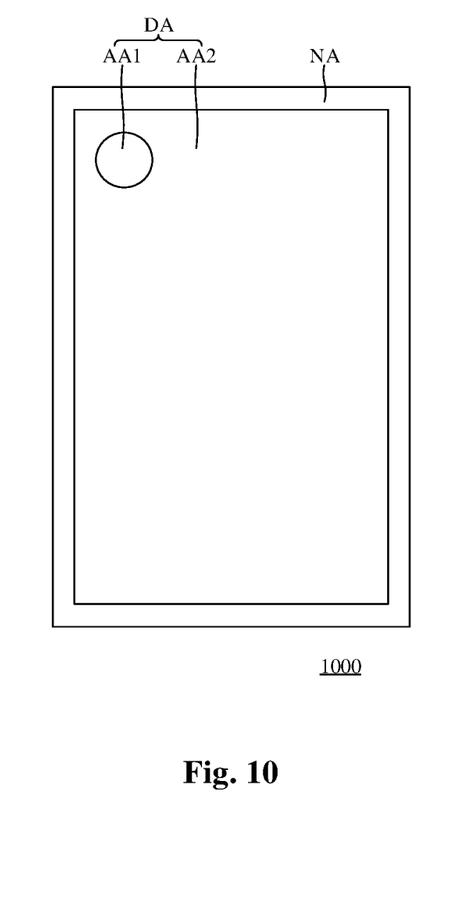
FIG. 10 is a schematic structural diagram of a display panel provided according to a second embodiment of the present application.

FIG. 10 is a schematic structural diagram of a display panel provided according to a second embodiment of the present application. In this embodiment, the display panel 1000 includes a display area DA and a non-display area NA surrounding a periphery of the display area DA, wherein the display area DA includes a first sub-display area AA1 and a second sub-display area AA2, the pixel structure of any of the foregoing embodiments is disposed in any one of the first sub-display area AA1 and the second sub-display area AA2. In this embodiment, the first sub-display area AA1 is formed in a circular shape, the second sub-display area AA2 is arranged surrounding a periphery of the first sub-display area AA1, and the pixel structure of any of the foregoing embodiments is, for example, arranged in the first sub-display area AA1. It can be understood that the shape and interconnection of the first sub-display area AA1 and the second sub-display area AA2 may not be limited to the above examples. In other embodiments, the first sub-display area AA1 may be polygonal, elliptical and other shapes, or even is an odd shape, and the second sub-display area AA2 may surround the first sub-display area AA1, may half surround the first sub-display area AA1, or may be adjacent to the first sub-display area AA1. In some other embodiments, the pixel structure of any of the foregoing embodiments may be disposed in the second sub-display area AA2.

The pixel structure includes a plurality of repeating units RU arranged repeatedly, each repeating unit RU includes two pixel units 110 having the same shape and adjacent to each other, and each pixel unit 110 is formed in a triangular shape. Each pixel unit 110 includes a plurality of sub-pixels 111 and at least one first light-transmitting portion 112. The plurality of sub-pixels 111 include a first sub-pixel 111*a*, a second sub-pixel 111*b* and a third sub-pixel 111*c* with different colors. The first sub-pixel 111*a*, the second sub-pixel 111*b* and the third sub-pixel 111*c* are respectively located between a corresponding edge of the pixel unit 110 and the center O1 of the pixel unit 110. Each of the first light-transmitting portions 112 is located at one vertex of the pixel unit 110. In each repeating unit RU, the two pixel units 110 have coincident edges which are of equal length and coincident with each other.

According to the display panel 1000 of the embodiment of the present application, each pixel unit 110 includes a plurality of sub-pixels 111 and a first light-transmitting portion 112. The plurality of sub-pixels 111 include a first sub-pixel 111*a*, a second sub-pixel 111*b* and a third sub-pixel 111*c* with different colors, and the sub-pixels 111 of the three colors can be used to display three primary colors and respectively located between a corresponding edge of the pixel unit 110 and the center O1 of the pixel unit 110 to present a regular arrangement in each pixel unit 110, so that the color rendering of the display panel 1000 is higher and the display effect is better. Each first light-transmitting portion 112 is located at a vertex of the pixel unit 110, and in each repeating unit RU, there are coincident edges CE which are of equal length and coincident with each other between the two pixel units 110, so that the first light-transmitting portions 112 in the pixel structure forms a regular and more uniformly distributed arrangement structure, which improves the light transmittance of the display panel 1000 and enables the light to be uniformly transmitted to a certain extent. Thus, it is convenient to achieve the light-transmitting display of the display panel 1000 and the under-screen photosensitive element integration of the display panel 1000.

Taking the under-screen photosensitive element integration of the display panel 1000 as an example, the display panel 1000 includes a display surface and a non-display surface opposite to each other. The photosensitive element can be disposed on the side of the display panel 1000 where the non-display surface is located, and the position of the photosensitive element corresponds to the area on the display panel 1000 where the above-mentioned pixel structure is provided. The photosensitive element can be an image acquisition device for acquiring external image information, wherein the photosensitive element is an image acquisition device in the form of a Complementary Metal Oxide Semiconductor (CMOS), a Charge-coupled Device (CCD), etc. . . . . It can be understood that the photosensitive element may not be limited to an image acquisition device, for example, in some embodiments, the photosensitive element may also be an optical information acquisition device such as a fingerprint identification device, an infrared sensor, a proximity sensor and other light sensors.

By integrating the photosensitive elements on the side of the display panel 1000 where the non-display surface is located to realize the under-screen integration of the photosensitive elements of the image capture device, and meanwhile enabling the display panel 1000 still displaying images in the area where the photosensitive elements are integrated, a full screen design of the display panel 1000 can be achieved.

According to the above-mentioned embodiments of the present application, these embodiments do not describe all details exhaustively, nor do they limit the application to only the specific embodiments described. Obviously, according to the above description, many modifications and changes can be made. This specification selects and describes these embodiments in details, in order to better explain principles and practical applications of this application, such that those skilled in the art can make good use of this application and make modifications on the basis of this application. This application is only limited by the claims and their full scope and equivalents.

What is claimed is:

1. A pixel structure, comprising a plurality of repeating units arranged repeatedly, each of the repeating units comprising two pixel units having the same shape and adjacent to each other, each of the pixel units being formed in a triangular shape, and each of the pixel units comprising:
a plurality of sub-pixels, comprising a first sub-pixel, a second sub-pixel and a third sub-pixel with different colors, wherein the first sub-pixel, the second sub-pixel and the third sub-pixel are respectively located between a corresponding edge of the pixel unit and the center of the pixel unit; and
at least one first light-transmitting portion, wherein each of the at least one first light-transmitting portion is located at a vertex of the pixel unit; wherein
in each of the repeating units, the two pixel units have coincident edges which are of equal length and coincident with each other,
wherein each of the pixel units is formed in an equilateral triangular shape, and the shapes of the first sub-pixel, the second sub-pixel and the third sub-pixel are the same as each other, and in each of the pixel units, every two adjacent sub-pixels are respectively disposed on two sides of a center line of the pixel unit, and each vertex of the pixel unit is provided with the first light-transmitting portion,
wherein the plurality of the repeating units are arranged along a first direction to form a pixel column, wherein the coincident edge in each repeating unit is perpendicular to the first direction, a plurality of the pixel columns are arranged along a second direction, wherein the second direction is perpendicular to the first direction,
wherein the adjacent pixel columns are misaligned from each other along the first direction, and the sub-pixels facing each other in the adjacent pixel columns have the same color.

2. The pixel structure of claim 1, wherein in each of the repeating units, the colors of the sub-pixels respectively corresponding to the two pixel units having the coincident edges and respectively corresponding to the coincident edges are the same as each other.

3. The pixel structure of claim 1, wherein in each of the repeating units, the two pixel units are arranged symmetrically with respect to a midpoint of the coincident edge.

4. The pixel structure of claim 1, wherein each of the sub-pixels is formed in an axisymmetric pentagonal shape.

5. The pixel structure of claim 1, wherein in each of the pixel units, the shapes of the first light-transmitting portions are the same as each other.

6. The pixel structure of claim 5, wherein each of the first light-transmitting portions is formed in a spindle shape.

7. The pixel structure of claim 6, wherein the first light-transmitting portions sharing a common vertex form a regular hexagon.

8. The pixel structure of claim 1, wherein the first sub-pixels in the adjacent pixel columns are interconnected as a first interconnection block, and the second sub-pixels in the adjacent pixel columns are interconnected as a second interconnection block, wherein the first interconnection block and the second interconnection block have the same shape.

9. The pixel structure of claim 1, wherein the adjacent pixel columns are misaligned from each other along the first direction by a first preset distance, the distance between the central axes of the adjacent pixel columns is a second preset distance,
wherein the first preset distance is equal to a height of an equilateral triangle, and the second preset distance is equal to half of a length of an edge of the equilateral triangle, so that the adjacent pixel columns are connected to each other.

10. The pixel structure of claim 9, wherein the first sub-pixels in the adjacent pixel columns are interconnected as a first interconnection block, and the second sub-pixels in the adjacent pixel columns are interconnected as a second interconnection block, in each of the repeating units, the third sub-pixels of the two pixel units are corresponding to the coincident edge and interconnected as a third interconnection block, wherein the first interconnection block, the second interconnection block and the third interconnection block have the same shape.

11. The pixel structure of claim 1, wherein the adjacent pixel columns are misaligned from each other along the first direction by a first preset distance, the distance between the central axes of the adjacent pixel columns is a second preset distance, wherein the first preset distance is equal to a height of the equilateral triangle, and the second preset distance is greater than half of a length of an edge of the equilateral triangle, so that the adjacent pixel columns are spaced apart from each other.

12. The pixel structure of claim 11, further comprising a second light-transmitting portion located between the adjacent pixel columns.

13. The pixel structure of claim 11, wherein the second preset distance is equal to the first preset distance, the second preset distance is equal to a height of the equilateral triangle, and the ratio of the arrangement density of the pixel units in the first direction to the arrangement density of the pixel units in the second direction is 1:1.

14. The pixel structure of claim 1, wherein the first sub-pixel, the second sub-pixel and the third sub-pixel are respectively used for displaying three primary colors.

15. The pixel structure of claim 1, wherein each of the sub-pixels is an organic light emitting diode light-emitting element, the sub-pixel comprises a plurality of organic film layers, at least some of the organic film layers can be formed by an evaporation process.

16. A display panel comprising the pixel structure of claim 1.

17. The display panel of claim 16, comprising a display area and a non-display area surrounding a periphery of the display area, the display area comprising a first sub-display area and a second sub-display area, the pixel structure is arranged in any one of the first sub-display area and the second sub-display area.

18. The pixel structure of claim 1, wherein, in each of the repeating units, the pixel edges of the plurality of sub-pixels in the two pixel units, in the direction perpendicular to the coincident edges, are on the same straight line.

19. A pixel structure comprising:
a plurality of repeating units arranged repeatedly, each repeating unit of the plurality of repeating units comprising two pixel units having the same shape and adjacent to each other, one pixel unit of the two pixel units has a triangular shape and comprises:
a plurality of sub-pixels, comprising a first sub-pixel and a second sub-pixel with different colors;
a plurality of first light-transmitting portions, wherein each of the at least one first light-transmitting portion is located at a vertex of the pixel unit; wherein in each of the repeating units, the two pixel units have coincident edges which are of equal length and coincident with each other; and
in each of the repeating units, the pixel edges of the plurality of sub-pixels in the two pixel units, in the direction perpendicular to the coincident edges, are on the same straight line.

* * * * *